US011532356B2

(12) United States Patent
Sharma et al.

(10) Patent No.: US 11,532,356 B2
(45) Date of Patent: Dec. 20, 2022

(54) SELF-HEALING DOT-PRODUCT ENGINE

(71) Applicant: Hewlett Packard Enterprise Development LP, Houston, TX (US)

(72) Inventors: Amit S. Sharma, Milpitas, CA (US); John Paul Strachan, San Carlos, CA (US); Catherine Graves, Milpitas, CA (US); Suhas Kumar, Milpitas, CA (US); Craig Warner, Plano, TX (US); Martin Foltin, Fort Collins, CO (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 17/223,435

(22) Filed: Apr. 6, 2021

(65) Prior Publication Data

US 2021/0225440 A1 Jul. 22, 2021

Related U.S. Application Data

(63) Continuation of application No. 16/364,717, filed on Mar. 26, 2019, now Pat. No. 10,984,860.

(51) Int. Cl.
*G11C 13/00* (2006.01)
*G06N 3/04* (2006.01)
(Continued)

(52) U.S. Cl.
CPC ........ *G11C 13/003* (2013.01); *G06F 11/1068* (2013.01); *G06N 3/04* (2013.01); *G11C 29/52* (2013.01)

(58) Field of Classification Search
CPC ... G11C 13/003; G11C 29/52; G06F 11/1068; G06N 3/04
See application file for complete search history.

(56) References Cited

U.S. PATENT DOCUMENTS 5,828,812 A 10/1998 Khan et al.
7,406,652 B2 7/2008 Tseng et al.
(Continued)

FOREIGN PATENT DOCUMENTS

CN 106463171 2/2017
CN 107636640 1/2018
(Continued)

OTHER PUBLICATIONS

Duan, S. et al., "The Design of a Graphical User Interface for a Memristor and Its Application in Memory of Memristive Crossbar Array," Journal of Southwest University (Natural Sciences Edition), Sep. 2014.
(Continued)

*Primary Examiner* — Kyle Vallecillo
(74) *Attorney, Agent, or Firm* — Hewlett Packard Enterprise Patent Department

(57) ABSTRACT

A DPE memristor crossbar array system includes a plurality of partitioned memristor crossbar arrays. Each of the plurality of partitioned memristor crossbar arrays includes a primary memristor crossbar array and a redundant memristor crossbar array. The redundant memristor crossbar array includes values that are mathematically related to values within the primary memristor crossbar array. In addition, the plurality of partitioned memristor crossbar arrays includes a block of shared analog circuits coupled to the plurality of partitioned memristor crossbar arrays. The block of shared analog circuits is to determine a dot product value of voltage values generated by at least one partitioned memristor crossbar array of the plurality of partitioned memristor crossbar arrays.

17 Claims, 8 Drawing Sheets

(51) Int. Cl.
  *G11C 29/52*   (2006.01)
  *G06F 11/10*   (2006.01)

(56)        References Cited

U.S. PATENT DOCUMENTS

| | | | |
|---|---|---|---|
| 8,745,279 | B2 | 6/2014 | Kreissig et al. |
| 8,924,786 | B2 | 12/2014 | Menon et al. |
| 9,847,974 | B2 | 12/2017 | Kompalli |
| 2003/0023893 | A1 | 1/2003 | Lee et al. |
| 2004/0019835 | A1 | 1/2004 | Marisetty et al. |
| 2005/0041472 | A1 | 2/2005 | Matsuoka et al. |
| 2006/0039196 | A1 | 2/2006 | Gorobets et al. |
| 2008/0098280 | A1 | 4/2008 | Andersen |
| 2010/0100764 | A1 | 4/2010 | Kalos |
| 2014/0172937 | A1 | 6/2014 | Linderman et al. |
| 2015/0248332 | A1 | 9/2015 | Ordentlich et al. |
| 2016/0085653 | A1 | 3/2016 | Li et al. |
| 2016/0379092 | A1 | 12/2016 | Kutliroff |
| 2016/0379115 | A1 | 12/2016 | Burger et al. |
| 2017/0102997 | A1 | 4/2017 | Purushothaman et al. |
| 2017/0134038 | A1 | 5/2017 | Buchanan |
| 2017/0148513 | A1 | 5/2017 | Buchanan |
| 2017/0178725 | A1 | 6/2017 | Yang et al. |
| 2017/0185543 | A1 | 6/2017 | Nieuwejaar |
| 2017/0206962 | A1 | 7/2017 | Buchanan |
| 2017/0221579 | A1 | 8/2017 | Buchanan |
| 2017/0249989 | A1 | 8/2017 | Strachan et al. |
| 2017/0345497 | A1* | 11/2017 | Kvatinsky .............. H03K 19/20 |
| 2018/0012411 | A1 | 1/2018 | Richey et al. |
| 2018/0075337 | A1* | 3/2018 | Buchanan ................ G06N 3/08 |
| 2018/0095930 | A1 | 4/2018 | Lu et al. |
| 2018/0309451 | A1 | 10/2018 | Lu et al. |
| 2018/0364785 | A1 | 12/2018 | Hu et al. |
| 2019/0189174 | A1 | 6/2019 | Hu et al. |
| 2020/0053121 | A1 | 2/2020 | Wilcox |
| 2020/0073755 | A1 | 3/2020 | Strachan et al. |
| 2020/0312406 | A1 | 10/2020 | Sharma et al. |

FOREIGN PATENT DOCUMENTS

| | | |
|---|---|---|
| CN | 108205705 | 6/2018 |
| CN | 108431895 | 8/2018 |
| CN | 109063833 | 12/2018 |
| CN | 109448068 A | 3/2019 |
| CN | 109472348 A | 3/2019 |

OTHER PUBLICATIONS

Ben Feinberg et al., "Making Memristive Neural Network Accelerators Reliable," Feb. 2018, pp. 1-14, University of Rochester, Rochester, NY, USA.

Brandon Reagen et al., "Minerva: Enabling Low-power, Highly-accurate Deep Neural Network Accelerators," Jun. 2016, pp. 1-12, Harvard University.

Gupta, D.; "Transfer Learning & the Art of using Pre-trained Models in Deep Learning"; Jun. 1, 2017; 27 pages.

Jiang, H. et al., "Pulse-Width Modulation based Dot-Product Engine for Neuromorphic Computing System using Memristor Crossbar Array," May 27-30, 2018, IEEE, pp. 1-4.

Lerong Chen et al., "Accelerator-friendly Neural-network Training: Learning Variations and Defects in RRAM Crossbar," Mar. 2017, pp. 19-24, EDAA.

Mathew, J. et al., "Fault Detection and Repair of DSC Arrays through Memristor Sensing," Oct. 12-14, 2015, IEEE, pp. 7-12.

Thibaut Marty et al., "Algorithm Level Timing Speculation for Convolutional Neural Network Accelerators," Jun. 8, 2018, pp. 1-21, HAL.

* cited by examiner

SELF-HEALING DOT-PRODUCT ENGINE

BACKGROUND

While techniques for detecting and correcting errors currently exist, these techniques are limited, for instance, to a finite set of errors and systems such as analog systems for multi-layer neural network computations. However, error detection and correction encoding schemes that enhance reliability and resiliency, including that of neural network accelerators and other Dot-Product Engine (DPE)-based matrix operations (e.g., Discrete Fourier Transform or image filtering), has not been achieved. The size of synaptic operations within a Deep Neural Network is expected to grow to vast scales as the human brain is composed of synaptic connections on the order of $10^{11}$ neurons. As the use of neural network accelerators continues to expand to new use cases, error detection and correction encoding that increase system reliability and resilience will become exceeding significant.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
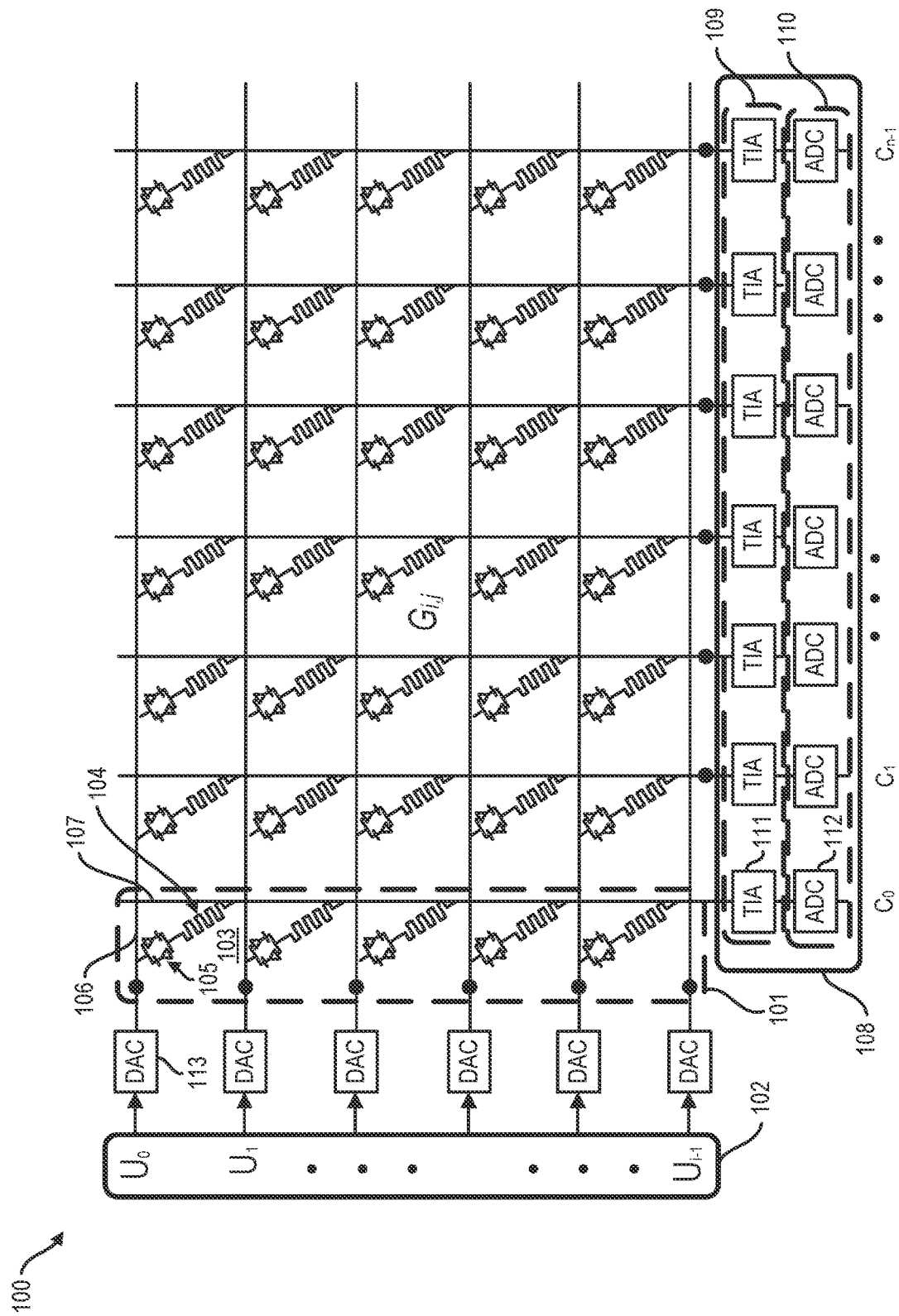
FIG. 1 is a schematic of a memristor crossbar array, according to one or more implementations of the present disclosure.

Illustrative examples of the subject matter claimed below may now be disclosed. In the interest of clarity, not all features of an actual implementation are described in this specification. It may be appreciated that in the development of any such actual implementation, numerous implementation-specific decisions may be made to achieve the developers' specific goals, such as compliance with system-related and business-related constraints, which may vary from one implementation to another. Moreover, it may be appreciated that such a development effort, even if complex and time-consuming, would be a routine undertaking for those of ordinary skill in the art having the benefit of this disclosure.

Where a range of values is provided, it is understood that each intervening value, to the tenth of the unit of the lower limit unless the context clearly dictates otherwise, between the upper and lower limit of that range, and any other stated or intervening value in that stated range, is encompassed within the disclosure. The upper and lower limits of these smaller ranges may independently be included in the smaller ranges, and are also encompassed within the disclosure, subject to any specifically excluded limit in the stated range. Where the stated range includes one or both of the limits, ranges excluding either or both of those included limits are also included in the disclosure.

The scale of synaptic operations within Deep Neural Networks are expected to increase. For example, pervasive use of Deep Neural Networks in the Edge, Internet-of-Things, and data-center deployments suggest unlimited growth in sheer volume of deployed accelerators. The multiplicative effect of large capacity accelerators and massive volumes imply that statistically improbable issues (e.g., six-sigma and beyond) may manifest a significant degree of errors during deployments. In shifting neural network synaptic weights from external memory on to the die at such scale, DPE-based solutions thus incur an obligation to provide high-availability and reliability that has been relegated to high-end memory sub-systems. In addition, the ubiquitous adoption of memory controllers has led to the development and implementation of error checking and correction (ECC), scrubbing, sparring, etc.

The deployment of memristor-based DPEs implemented in Edge computing offers a variety of breakthrough applications. For instance, memristor-based DPE's provide the ability to obtain valid inference results through power cycles, physical environment fluctuations, and unreliable connectivity to the cloud. However, the challenges with such deployments include: (1) latent defects and wear-out fatigue which may result in malfunctions; (2) transitory issues inherent in nanoscale devices or external environmental perturbations; and (3) explicit design decisions to narrow the operation range to probable operating conditions.

There are several challenges which must be overcome for reliable DPE-based deployments to reach massive scale. For instance, the nanoscale feature size of memristor devices instantiated in massive quantities within an accelerator provide significant design challenges.

Herein, a memristor device is defined as a passive, two-terminal electrical component which exhibits characteristics of a programmable resistor. The conductance of a memristor device is determined by a non-volatile state that is a function of previously applied voltages and currents. Advantageously, memristor devices can achieve several states through the movement of ions within the memristor device and can be programmed to four, eight, or more states (e.g., up to $2^8$) states. Notably, memristor devices are typically non-volatile, meaning that they retain memory without power.

The design challenge of covering an entire problem domain implementing memristor-based DPEs can arise from various operating modes necessary for a DPE (e.g., write to individual devices, reading individual devices, read from entire columns with wider range in currents, etc.).

Within a memristor crossbar array, there can be significant variance between memristor devices, even in neighboring memristor cells, and therefore the generated currents within a DPE may vary significantly as well. The present disclosure provides a mechanism to modulate the operating point (e.g., optimal operating center) of the analog circuitry that is assigned to detect the current/voltage for a respective memristor column within a memristor array to account for this variance in memristor performance.

In addition, Random Telegraph Noise (RTN), for example, results in the depletion of a portion of the conductive filament due to the presence of temporarily trapped charges. RTN can result in intermittent read errors with sufficient probability to cause an unacceptable operation of the system. In addition, other common device issues such as thermal noise, supply noise, ground bounce, signal ringing, etc. may lead to transitory read errors. Furthermore, relaxation can result in the degradation of memristor states and cumulative reads can disturb a memristor's state over time. The system analog circuits (e.g., amplifiers and analog-to-digital converters) may also become vulnerable to degradation which may lead to incorrect vector multiplication products. For example, some analog-to-digital converters (such as SAR ADCs) implemented within systems that perform vector multiplication operations utilize integrated circuit capacitors (e.g., deep trench, metal-on-metal, or metal-on-semiconductor, etc.) that are susceptible to wear-out over time.

Vector multiplication, along with other operations, can be performed by a DPE. A DPE is a high density and high-power-efficiency accelerator which can approximate matrix-vector multiplication tasks associated with neural network applications. In some implementations, a DPE can offload certain multiplication elements common in neural network interfaces. A DPE can accept as input an l×n matrix A, where $A=(a_{i,j})_{i\in[l>,j\in[n>}$ over $\Sigma_q$ and a row vector $u=(u_j)_{i\in[j>}\in \Sigma^l_q$, to compute the vector-matrix product c=uA, with addition and multiplication carried out over Z. In one implementation, i and n are fixed positive integers such that the matrix A is realized as a crossbar array comprising of i row conductors, n columns conductors, in addition to programmable nanoscale resistors (e.g, memristor devices) at the junctions, with the resistor at the junction (i, j) programmed to a specific conductance, $G_{i,j}$, that is proportional to $a_{i,j}$. In one implementation of the present disclosure, the matrix A is modified much less frequently than the input vector u. In some implementations, the matrix A is determined once and then remains fixed, in which case u is provided as the only input. In one implementation, an integer q≥2, whereas $\Sigma_q$ denotes the subset q>={0, 1, ..., q−1} of the integer set Z. Typically, the alphabet size q is a power of 2.

In some implementations, each entry $u_i$ of u is fed into a digital-to-analog converter (DAC) to produce a voltage level that is proportional to $u_i$. In particular, a voltage is applied to each row line which generates a current on each column line. If the currents generated on each column line are summed, the value of this total current, which may be an analog value, is the dot product. The current associated with each memristor cell of a memristor column is converted to a voltage by an amplifier (e.g., TIA). The converted voltage may be translated to a digital value by an analog-to-digital converter (ADC). In some implementations, the TIA and ADC circuits are shared (e.g., via a multiplexer) with several memristor arrays. The product, uA, is then computed by reading the currents at the (grounded) column conductors after being fed into analog-to-digital converters (ADCs). Each memristor column within the memristor array may be read simultaneously. As such, the dot products for each respective memristor column may be generated and computed simultaneously.

Notably, instead of accessing one memristor cell at a time, as typical in memory reads (e.g., of a stored bit), the memristor array allows access of all memristor cells in a memristor column. In some implementations, each of the memristor cells within the memristor array are programmed as a result of implementing a neural network that is trained on a DPE. Accordingly, a pre-programmed trained neural network is applied to various applications, sometimes in real-time, to conduct inferences which involves read functions primarily as opposed to write functions.

FIG. 1 is a schematic of a memristor crossbar array 100, according to one or more implementations of the present disclosure. Memristor crossbar array 100 includes an array (e.g., array A) of memristor cells 103. Each memristor cell 103 includes a memristor device 104 and a selector device 105. The selector device 105 can be used to effectively control the switching access to a memristor device 104 and also prevents errors in the reading or writing of the memristor cell 103. A DPE can accept as input array A, where $A=(a_{i,j})_{i\in[l>,j\in[n>}$ over $\Sigma_q$ and a row vector $u=(u_j)_{i\in[j>}\in \Sigma^l_q$, to compute the vector-matrix product c=uA, with addition and multiplication carried out over Z. In one implementation, memristor crossbar array 100 includes i row conductors and n column conductors. In particular, a voltage is applied to each row line 106 which generates a current on each column line 107. If the currents generated on each column line 107 are summed, the value of this total current, which may be an analog value, is the dot product.

In some implementations, memristor crossbar array 100 is configured such that an entire memristor column 101 of memristor cells 103 can be read simultaneously. In operation, an input vector 102 can be applied to the memristor crossbar array 100 to perform matrix multiplication. For example, the memristor crossbar array 100 may be used for integer matrix multiplication. In FIG. 1, input vector 102 is represented by u. Input vector 102 may have unique values that are assigned to specific memristor cells 103.

In the implementation shown, each memristor device 104 has a unique conductance (G) value. Herein, conductance (G) is defined as the degree to which an object conducts electricity. Conductance is the reciprocal of the resistance and is measured in siemens. Accordingly, each of the inputs ($u_i$) of the input vector 102 that are applied to each of the memristor cells 103 of the memristor column 101 can produce a current which may be summed with the other currents produced in the other memristor cells 103 of the memristor column 101. The correct output vector (e.g., c) is equal to the product of the input vector 102 and the memristor crossbar array 100 (e.g., c=uA). However, because errors may be created during the generation of the output vector (y), the actual output vector may be expressed as (y)=μA+e, where e is the error vector.

Coupled to the memristor cells 103 is a pool 108 of analog circuits which includes a pool 109 of Trans-Impedance Amplifiers (TIAs) 111 and a pool 110 of analog-to-digital circuits (ADCs) 112. In one implementation, each TIA 111 is a current-to-voltage converter, implemented with one or more operational amplifiers. However, it should be understood by one having ordinary skill in the art that the present disclosure is not limited to Trans-Impedance Amplifiers 111 and that any suitable amplifier or device which can measure analog current can be used. The current measurements can be carried out in parallel, as shown, or serially, column-by-column, using a single measuring device.

Accordingly, when an input voltage is applied to the memristor crossbar array 100 (e.g., memristor column 101 of memristor cells 103), the cumulative current can be measured for each memristor column 101. In the implementation shown, each ADC 112 is coupled to the TIA 111. In some implementations, the ADC 112 for each memristor column 101 can convert an analog voltage signal to a digital signal.

Notably, the pool 108 of analog circuits may be time shared with other memristor crossbar arrays (e.g., memristor crossbar array "X"). Accordingly, the pool 108 of analog circuits may perform the dot product calculations for one or more memristor crossbar arrays.

Figure 2:
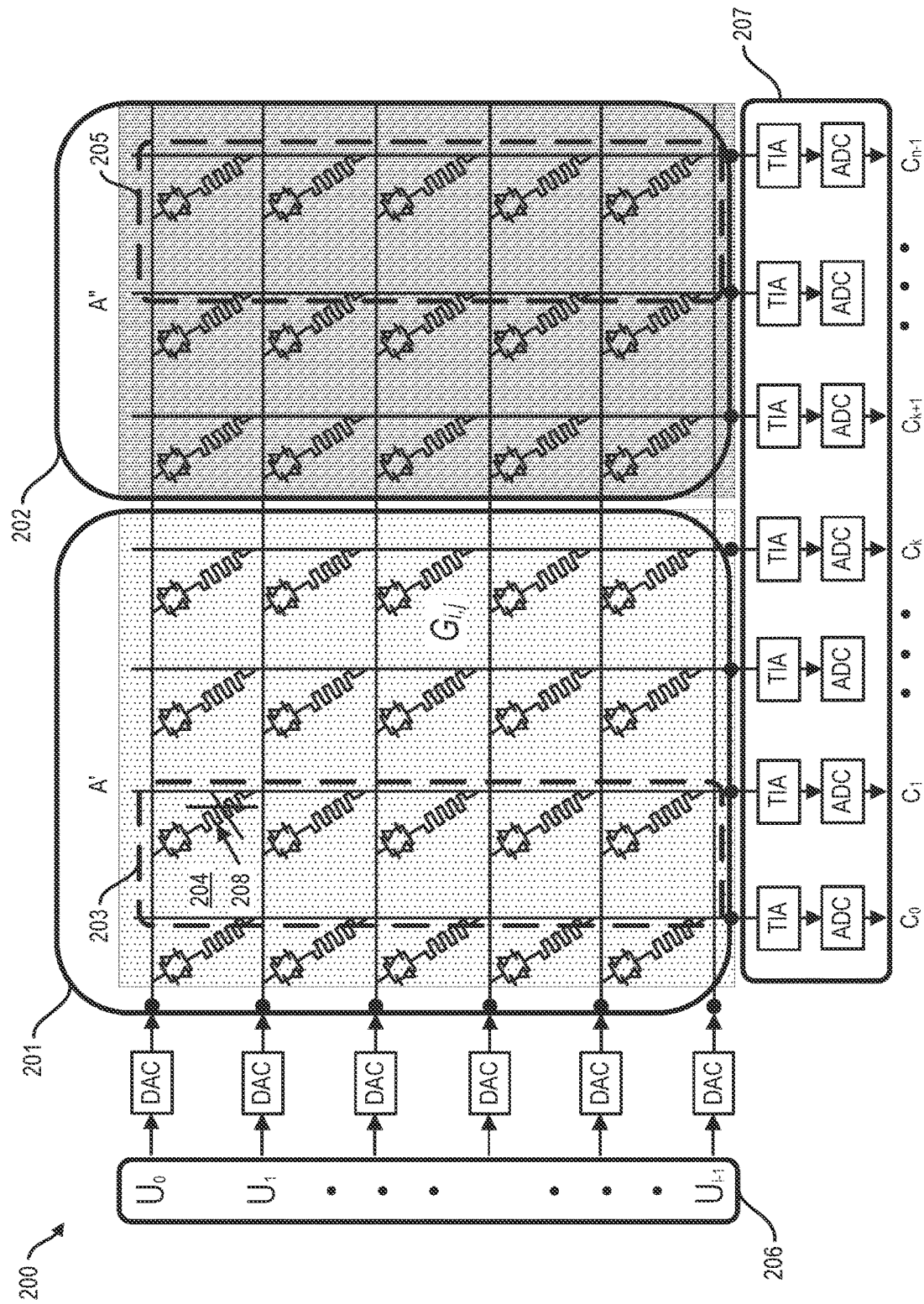
FIG. 2 is a schematic of a memristor crossbar array which implements a coding scheme for a fault-tolerant DPE, according to one or more implementations of the present disclosure.

FIG. 2 is a schematic of a memristor crossbar array 200 which implements a coding scheme for a fault-tolerant DPE, according to one or more implementations of the present disclosure. Advantageously, the present disclosure provides a self-healing and self-optimizing DPE. Notably, memristor crossbar array 200 includes a primary (e.g., operational) memristor crossbar array 201 and a redundancy memristor crossbar array 202. For crossbar arrays 201 and 202, in some implementations, there may exist a pool of spare columns of memristor cells. In an event that a memristor cell 204 is determined to be defective thereby rendering the dot product calculation for the associated memristor column 203 incorrect, a spare column 205 can replace column 203. In some implementations, the values (e.g., conductance values) programmed within each memristor cell 204 of the redundancy memristor crossbar array 202 is computed from one or more values programmed within the memristor cells 204 of the primary memristor crossbar array 201.

In one implementation, the values programmed into the redundancy memristor crossbar array 202 are mathematically related (e.g., via a mathematical equation) to the values programmed into the primary memristor crossbar array 201. It may be appreciated by those having ordinary skill in the art that each "read" of a memristor device may cause degradation of the device itself such that the memristor device drifts a small degree each time. Over time, these successive drifts may cause a significant shift such that the memristor device generates errors as the value presently associated with the memristor cell is notably different than that of the originally-programmed value (e.g., conductance). In other examples, the errors may be caused by a change in temperature experienced by the memristor cells. As such, the redundancy memristor crossbar array 202 may be used to determine the original state of a memristor cell 204 in the primary memristor crossbar array 201. If the memristor cell 204 which caused the error does not have defective memristor devices 205, the originally-programmed value can be re-programmed onto the memristor cell 204.

In some implementations, the size of the primary memristor crossbar array 201 with respect to the number of memristor devices is substantially greater than the size of the redundancy memristor crossbar array 202. However, in some implementations, the redundancy memristor crossbar array 202 can still be used to correct each error that is caused by defects in the primary memristor crossbar array 201. Additionally, in some implementations, the coding of redundant crossbar 202 is such that errors can be detected and corrected in either or both the primary crossbar array 201 or redundant crossbar array 202.

It should be understood by those having ordinary skill in the art that memristor devices can exhibit significant variance as they are nanoscale devices. In particular, inaccuracies while programming the resistors in the crossbar array and noise while reading the currents are examples of factors that can affect the accuracy of the computation. Specifically, the actually-read row vector, $y=(y_j)_{j \in [n]} \in Z^n$, may differ from the correct vector, $c=uA$. The error vector is defined as the following vector in $Z^n$: $e=(e_j)_{j \in [n]}=y-uA$. In such context of errors, the number of errors may be referenced as $L_{-1}$-norm of e: $\|e\|=\|e\|_1=\Sigma^{j \in [n]}|e_j|$. In one implementation, is also referred to as the Manhattan weight of e, which equals the Manhattan distance between uA and y.

In addition, computational errors may be caused by junctions in the memristor crossbar array being shorted due to faults in the programming process. In this case, the current read in the shorted column may be above some compliance limit ("∞"), which, in turn, may flag the respective entry in y as "unavailable" or as an erasure (ρ). In addition, shorts may also result from latent manufacturing defects, which may or may not be detected before the DPE is deployed. In another example, a junction in the array may become non-programmable or get stuck at an open state, in which cases the respective entry in y could be off the correct value by as much as $+/-(q-1)^2$. Such errors may be counted through their contribution to the $L_{-1}$-norm of the error vector. Alternatively, if this type of error is predominant, the Hamming metric may be employed, whereby the figure of merit is the Hamming weight of e, equaling the number of positions in which y differs from uA (disregarding the extent at which the values of the respective entries actually differ). In some implementations, the Hamming metric may be suitable for handling erasures as well.

Additionally, the present disclosure provides a means for employing the DPE computational power to self-protect the computations against errors. The first k (<n) entries in c=uA can carry the result of the computation of interest, while the remaining n−k entries of c can contain redundancy symbols which can be used to detect or correct computational errors being that the number of the latter may be bounded from above by one or more design parameter(s).

As shown in FIG. 2, the programmed l×n matrix memristor crossbar array 200 may have the structure A=(A'|A"), where the primary memristor crossbar array 201 (A') is an l×k matrix over $\Sigma_q$ which includes the first k columns of A, and the redundancy memristor crossbar array 202 (e.g., A") includes the remaining n−k column. The computed output row vector for an input vector $u \in \Sigma_q$ is therefore c=(c'|c"), where the k-prefix $c'=uA'(\in Z^k)$ represents the target computation while the (n−k)-suffix $c''=uA'' (\in Z^{n-k})$ is the redundancy component. In this implementation, the primary memristor crossbar array 201 (A') and the input vector 206 (u) are the actual inputs, and the redundancy memristor crossbar array 202 (e.g., A") is computed from the primary memristor crossbar array (A), by a dedicated circuitry, prior to, or while programming A' and A" into the memristor crossbar array. In some implementations, n−k is minimized in view of the designed error correction capability.

The memristor cells 204 of the primary memristor crossbar array 201 may fail unwittingly without notice. In the case of an error, a test vector may be applied to the primary memristor crossbar array 201 to determine which of the memristor cells 204 of a memristor column 203 have become defective based upon the output analog circuits (e.g., TIA and ADC) 207. In one implementation, a test vector is implemented as the input vector 206 and applied to the primary memristor crossbar array 201. Further, a dedicated decode circuitry (not shown) may be capable of computing the syndrome, s, of y using α, a pre-defined constant that functions as a code locator. In one implementation, the coding and decoding schemes can correct τ errors and detect τ+φ errors in the presence of ρ erasures when τ, φ, and ρ are non-negative integers.

Given non-negative integers τ and φ, a coding scheme is referred to correct τ errors and detect τ and φ errors in the $L_{-1}$-metric or the Hamming metric, if the number of errors is $\tau$ or less, then the decoder must produce the correct result of the target computation; otherwise, if the number of errors is $\tau$ and $\phi$ or less, the decoder can flag decoding failure instead without producing an incorrect result.

The present disclosure provides a DPE coding scheme that detects two errors. Given an alphabet size q>=2 and a code length n, m=$\lceil \log_q(2n+1) \rceil$ and k=n=m (thus, m may be the redundancy). Let $\alpha = (\alpha_0 \alpha_1 \ldots \alpha_{n-1})$ be a vector in $Z^n$ that satisfies the following properties:

(i) The entries of $\alpha$ are non-zero distinct elements in [2n+1>

(ii) For any two indexes i, j, $\in$[n>, $\alpha_1 + \alpha_2 \neq 2n+1$.

(iii) $\alpha_{k+j} = q^j$, for j$\in$[n>.

$\alpha$ is referred to as code locators. Code locators that satisfy conditions (i)-(iii can be easily constructed for every q>=2 (e.g., when $q^{m-1}$i=<n, such that $\{\alpha_j\}_{j} \in$[n>, ={1, 2, 3, . . . , n), otherwise, $\{\alpha_j\}_{j \in [n>} = (\{1, 2, 3, \ldots, n\} \setminus \{2n+1-q^{m-1}\})$. Notably, $q^{m-1} < 2n+1$ and that $q^{m-2} =<$n, yet $q^{m-1}$ may be larger than n when q=2.

Let $y = (y_j)_{j \in [n>} = c + e = uA$ be the read vector at the output of the DPE, where e$\in Z^n$ is an error vector having at most one non-zero entry, equaling +/−1. The decoding may start by computing the syndrome of y, which is defined by $s = (y - \alpha^T)$ MOD (2n+1).

The coding schemes disclosed herein make use of the Lee metric, specifically Berlekamp codes (e.g., implementing the Hamming metric coding scheme in some implementations). Let p be an odd prime and let F=GF(p). Representing the elements of F as 0, 1, 2, . . . , p−1, the last (p−1), the last (p−1)/2 elements in this list may be referred to as the "negative" elements in F. The Lee metric over F is defined similarly to the $L_1$-metric over Z, using the following definition of the absolute value (in Z) of an element z$\in$F:

|z|={z} if z is "non-negative"

{p−z} otherwise

Also let B=$(B_0 B_1 \ldots B_{n-1})$ be a vector of length n over the extension field 0=GF($p^h$) whose entries are non-zero and distinct and satisfy $B_i + B_j \neq 0$ for every i, j$\in$[n>. The respective Berlekamp code, $C_{Ber} = C_{Ber}$ (B, $\tau$), is defined as the set of all row vectors in $F^{in}$ in the right kernel of the following $\tau \times$n parity-check matrix, $H_{Ber} = H_{Ber}*B$, $\tau$, over $\phi$;

$$H_{BER} = \begin{pmatrix} B_1 & B_2 & \ldots & B_n \\ B_1^3 & B_2^3 & \ldots & B_n^3 \\ B_1^5 & B_2^5 & \ldots & B_n^5 \\ \vdots & \vdots & \ldots & \vdots \\ \vdots & \vdots & \ldots & \vdots \\ \vdots & \vdots & \ldots & \vdots \\ B_1^{2T-1} & & & B_1^{2T-1} \end{pmatrix}$$

As such, $C_{Ber} = \{c \in F^n : c*H_{Ber}^\tau = 0\}$. Thus, $C_{Ber}$ is a linear [n, k] code over F with a redundancy n−k of at most $\tau h = \tau \lceil \log_p(2n+1) \rceil$.

Figure 3:
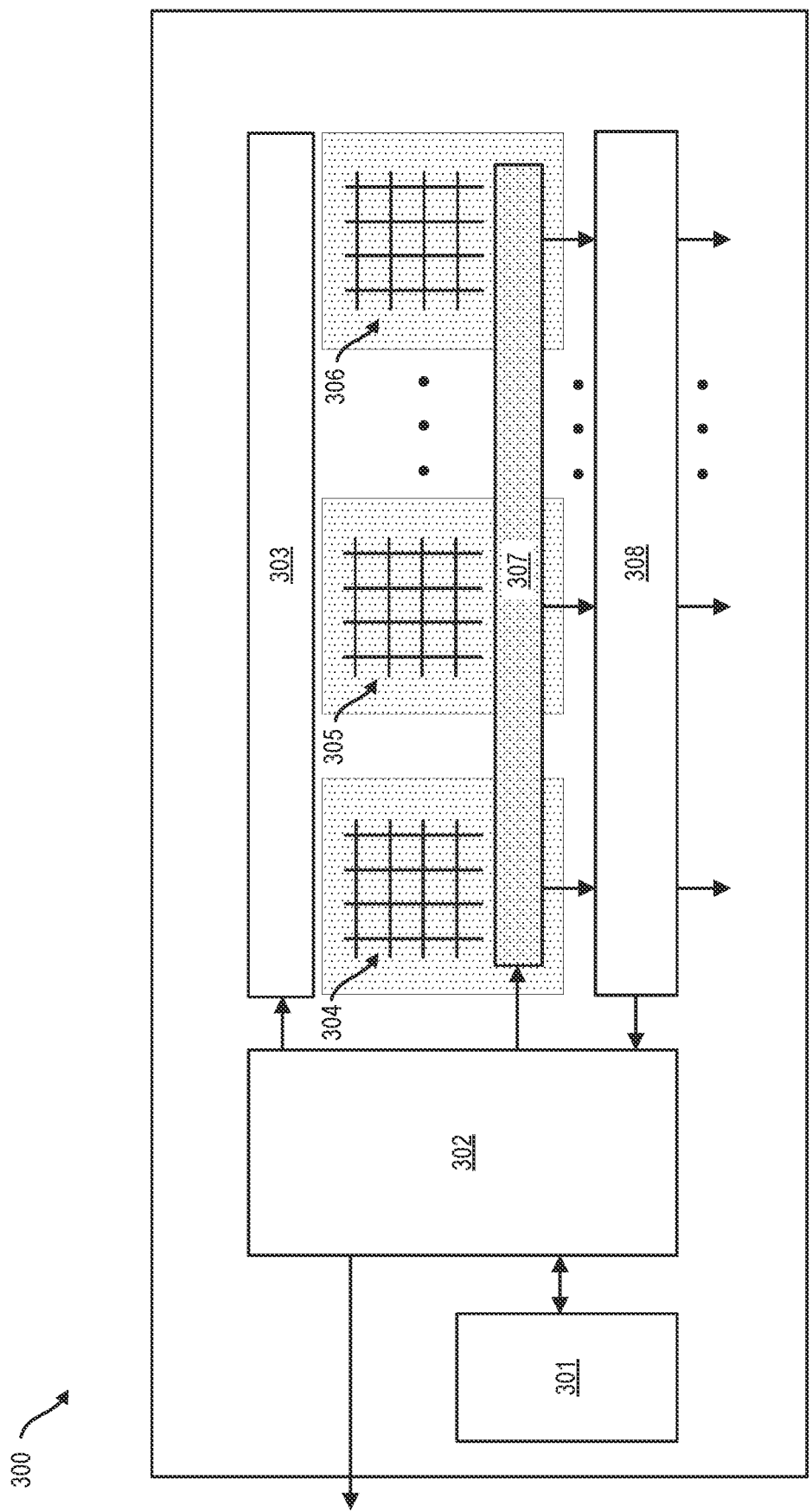
FIG. 3 is an architecture of a self-healing DPE system, according to one or more implementations of the present disclosure.

FIG. 3 is an architecture of a self-healing DPE system 300, according to one or more implementations of the present disclosure. Self-healing DPE system 300 includes several memristor crossbar arrays 304-306 which are all multiplexed to and shared with shared analog circuits block 307 (e.g., Trans-Impedance Amplifiers and Analog Digital Converters). In addition, an error detection and correction logic block 308 is coupled to the shared analog circuits block 307. In one implementation of the present disclosure, Berlekamp coding schemes may be implemented to detect and correct computational errors generated during the deployment of DPE matrix multiplication processes as previously described herein.

In one implementation, memristor crossbar array 306 is a dedicated test array. The memristor crossbar array 306 may have access to the shared analog circuits block 307 or may have access to a dedicated set of analog circuits (e.g., TIAs and ADCs). The cells in the memristor crossbar array 306 may hold the known values which can be used to determine frequently occurring errors with certain patterns or signatures due to the systematic issues in analog circuits. The dedicated test array 306 than thus assist in diagnosing specific analog sub-circuitry faults.

The results of the error detection and correction logic block 308 are routed to self-healing state machine 302. Self-healing state machine 302 may institute one or more response actions depending upon the detected error, as may be described in more detail in relation to FIG. 4. The self-healing state machine 302 monitors all activity within the DPE system 300. Based on the response actions, the self-healing state machine 302 can communicate these response actions to the local control logic block 303 or the analog circuits block 307. Statistics related to the detected and corrected errors generated by error detection and correction logic block 308 may be stored in a separate storage unit 301. The self-healing state machine 302 can tag and log detection and correction events. In the event that the error detection and correction logic block 308 detects an uncorrectable or otherwise catastrophic error, the self-healing state machine 302 may send an alert to a global processor control for exception processing and undertake advanced corrective actions.

Figure 4:
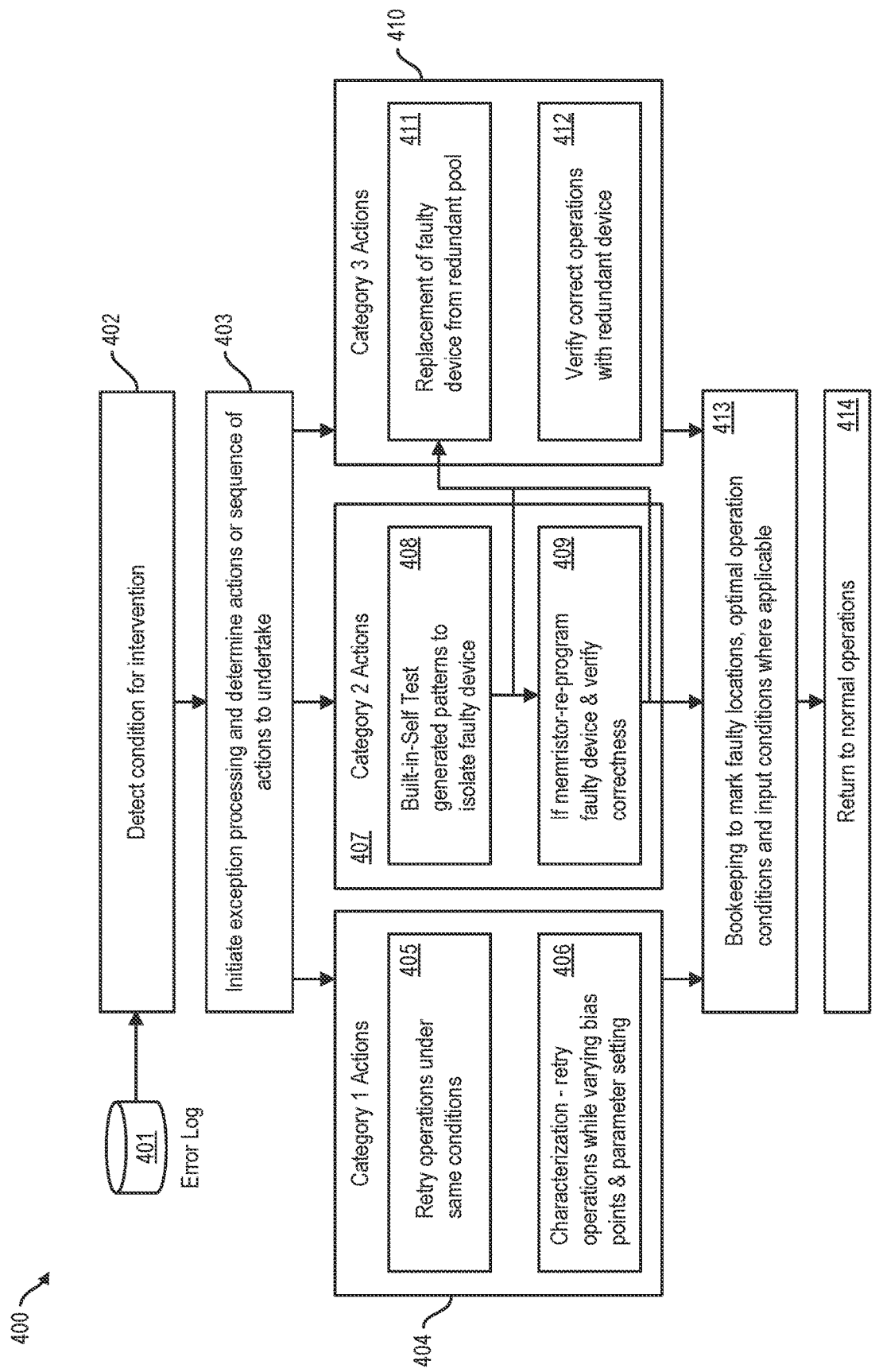
FIG. 4 depicts a self-healing state machine process flow, according to one or more implementations of the present disclosure.

FIG. 4 depicts a self-healing state machine process flow 400, according to one or more implementations of the present disclosure. The self-healing state machine process flow 400 displays an error log 401 which keeps track of errors and statistics generated by a DPE memristor crossbar array (e.g., memristor crossbar array 200) and error detection and correction logic (e.g., block 308). According to block 402 of the self-healing process flow 400, the state machine detects a condition for intervention. The condition for intervention may include the presence of any of uncorrectable errors, an excessive number of correctable errors, a failure pattern signature, or a pattern recognized from an analysis of log records.

Next, according to block 403, the process flow includes initiating exception processing and determining actions or a sequence of actions to undertake. According to the type of error detected, the self-healing state machine process flow 400 may initiate a category 1 action (block 404), a category 2 action (block 407), or a category 3 action (block 410) as described below. After a response action is performed, bookkeeping can be performed to mark faulty locations, optimal operation conditions, and input conditions where applicable according to block 413. Lastly, the normal operation (e.g., DPE) is resumed according to block 414.

According to block 404, the category actions 1 begin with retrying the operations under the same conditions which generated the errors (block 405). If the error is regenerated, the operation can be retried while varying the bias points or parameter settings (e.g., tweak the parameters) in an attempt to remedy the generated error (block 406).

Figure 7:
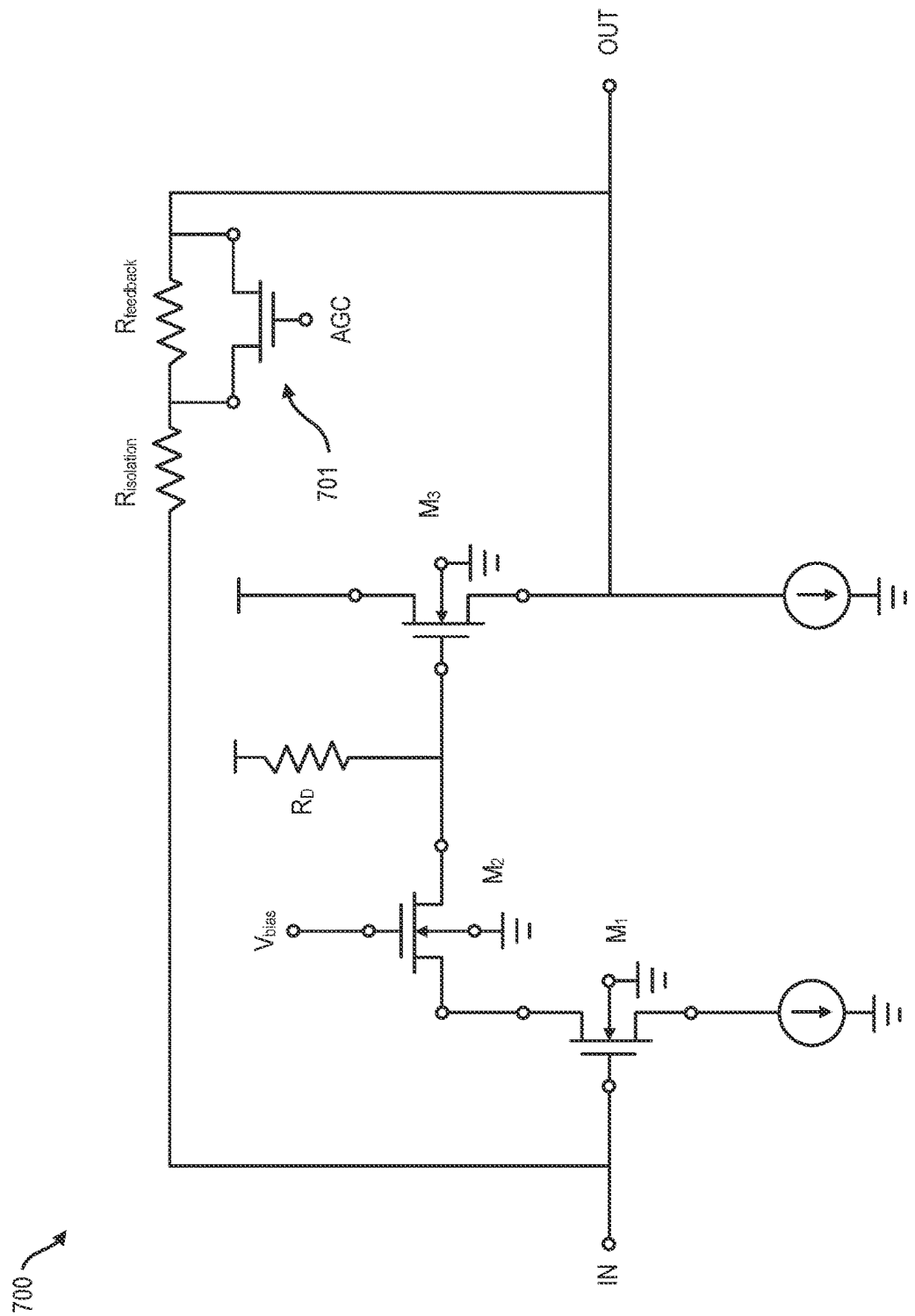
FIG. 7 is an illustration of a Trans-Impedance Amplifier according to one or more implementations of the present disclosure.

FIG. 7 is an illustration of a Trans-Impedance Amplifier 700 according to one or more implementations of the present disclosure. It should be understood by those having ordinary skill in the art that the present disclosure is not limited to the Trans-Impedance Amplifier 700 disclosed in FIG. 7. As such, other Trans-Impedance Amplifiers may be employed so long as their use does not depart from the spirit and scope of the present disclosure. Trans-Impedance Amplifier 700 will be described in relation to the Category 1 Action example below.

Example Category 1 Action

To illustrate aspects of the possible use case of self-healing action (1) emphasizing in-situ characterization, an example of a Trans-impedance Amplifier (TIA) 700 is considered. A typical TIA 700 of Cascode variety with adjustable gain control (AGC) 701 offers several tradeoffs that can be programmed via parameters such as bias setting of the Cascode device as well as the adjustment of gain by modulating the feedback impedance. The default settings may be tuned to cover the most likely range of min and max currents expected assuming all column devices are in LRS or HRS states. However, the variance of nano-scale devices such as memristors within a column of an array can be significant. Other sources of variation are the different operation modes, such as the read operation on a single cell. The TIA 700 default parameters may lead to incorrect calculated results if the aggregate variance results in currents that fall outside the window of operations. In such circumstances, real time adjustment to the TIA AGC 701 could yield correct results. An exception process that applies various values to the TIA's AGC 701 and measures correctness of the results is in this case executed by the self-healing state machine to find the optimal point. Similarly, a change in environmental variable (such as temperature) could result in greater signal noise on the input to the TIA 700. Adjusting the $V_{bias}$ of the Cascode devices can increase noise immunity but at the cost of loss in gain. The characterization process of searching for the optimal operating point can result in correct calculations, in some implementations.

Additionally, errors in devices in one column can have effects on neighboring columns due to additional sneak currents. These types of errors are deterministic and correctable through known formulas that adjust the offset and gain scale of the current sensed in the column of interest. Thus, the detection and correction of errors in a neighboring column should also be used to make minor corrections to a column that may have not yet have triggered a large enough error to be detected.

Returning back to FIG. 4, the category 2 actions can be performed (block 407). For example, according to block 408, a built-in self-test is deployed to generate patterns to isolate a faulty (e.g., memristor) device. If a memristor device is determined to be faulty, block 409 instructs that device is set to be re-programmed to verify its correctness. In another example, stochastic fluctuations (e.g., caused by relaxation) may lead to degradation of a programmed memristor state. In one example, the physical manifestation of this instability due to degradation is that the shape of the memristor device's filament changes thereby impacting the memristor device's conductivity. In one implementation, in the case where a memristor device has degraded due to repeated stress or the migration of defects, the faulty memristor device can be replaced by reconfiguring a memristor crossbar array such that the primary memristor crossbar array can incorporate a spare column that is stored in the memristor crossbar array. The spare column is re-programmed with correct values after it is incorporated into the primary memristor crossbar array.

Lastly, block 410 lists a few category 3 actions that may be instituted in response to an error. Category 3 actions may include those listed in blocks 411 and 412. Block 411 provides that a faulty (e.g., memristor) device or column of memristor devices be replaced from a redundant pool of memristor devices or columns. Once the faulty device has been replaced, the correct operations can be verified with the devices or columns from the redundant pool. Lastly, the correct operations can be verified with the redundant memristor crossbar array (block 412).

Figure 5B:
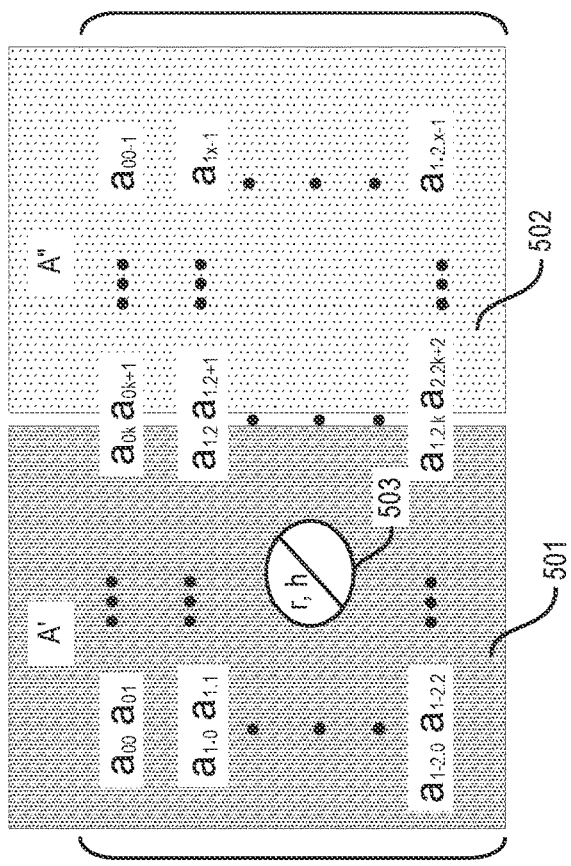
FIG. 5B depicts the encoded DPE of FIG. 5A having a faulty memristor device.
Figure 5A:
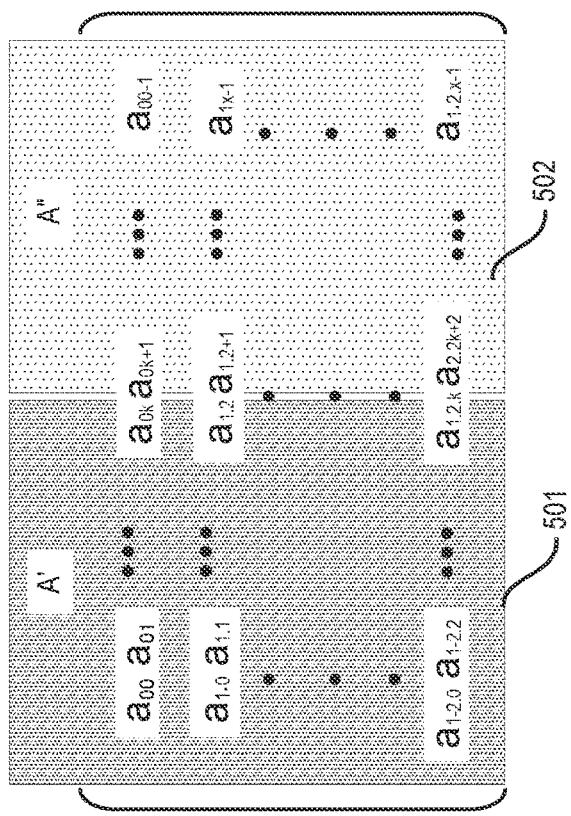
FIG. 5A depicts an encoded DPE, according to one or more implementations of the present disclosure.

FIG. 5A depicts one example of an encoded DPE, according to one or more implementations of the present disclosure. As shown, FIG. 5A depicts a memristor crossbar array which has an operational primary memristor crossbar array 501 that is proximate to a redundancy memristor crossbar array 502. As described in reference to FIG. 1, there exists an input vector, $u_{rid}$, for each row, r, where the input vector has a property such that the read output vector $y=u_{rid}A=[a_{r0}a_{r1} \ldots a_{rk}a_{rk+1} \ldots a_{m-1}]$. That is the computed output vector y is equal to the values programmed in the memristor devices of the row r. The decoded syndrome, s, of read output vector y can uniquely identify the specific element in y that has the faulty memristor device and the magnitude of the detected error caused by the faulty memristor device.

FIG. 5B depicts the encoded DPE of FIG. 5A which has a faulty memristor device. An initial computation with input vector, u, results in an actually read output vector y. The decoded syndrome, s, of y may uniquely identify the specific column (e.g., column k) in y that is erroneous and the magnitude of the error 503. A system interrupt can be triggered if an error occurs too frequently according to metrics instituted in a state machine.

For example, a successive application of input vectors, $u_{i|i=0}^{i=n-1}=[0_0, 0_1 \ldots 1, 0_{i+1} \ldots 0_{n-1}]$ can be employed to identify a specific element (e.g., $a_{r,h}$) in the primary crossbar array that is faulty in addition to the magnitude of the detected error 503. Other more efficient approaches that result in a binary search process are also feasible.

Figure 6:
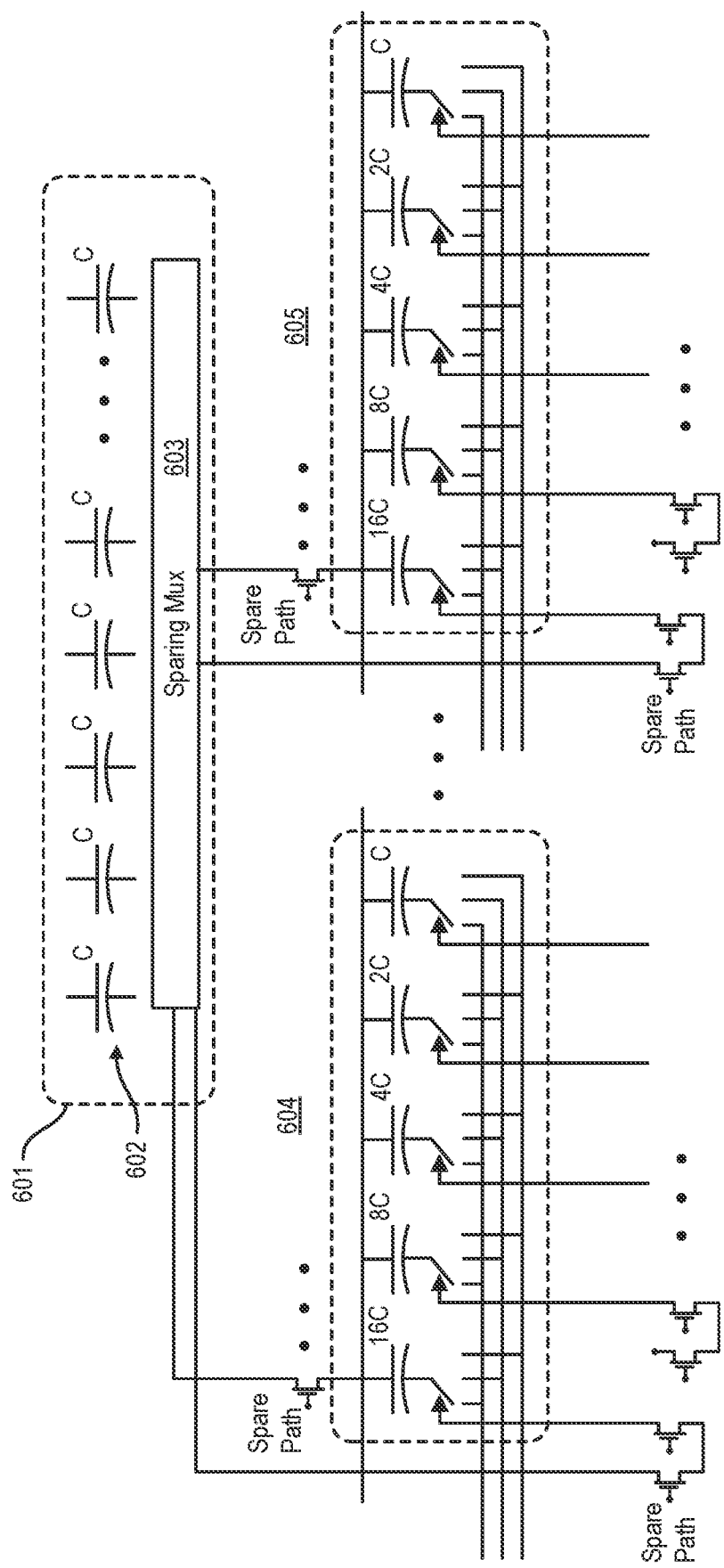
FIG. 6 is a schematic of a pool of spare capacitors to be shared within the self-healing Dot-Produce Engine system illustrated in FIG. 3.

FIG. 6 is a schematic of a pool 601 of spare capacitors 602 to be shared by one or more Capacitive Digital-to-Analog Converters (CDAC) 604, 605 within the self-healing Dot-Produce Engine system 300 illustrated in FIG. 3. In one implementation, the pool 601 of spare capacitors 602 are implemented within a Successive Approximation Register Analog-to-Digital Converter (SAR ADC). Herein, a SAR ADC is an analog-to-digital converter that can convert a continuous analog waveform into a discrete digital representation via a binary search through all possible quantization levels before finally converging upon a digital output for each conversion. The CDACs 604, 605 may access the pool 601 of spare capacitors 602 via the sparing multiplexer 603.

Figure 8:
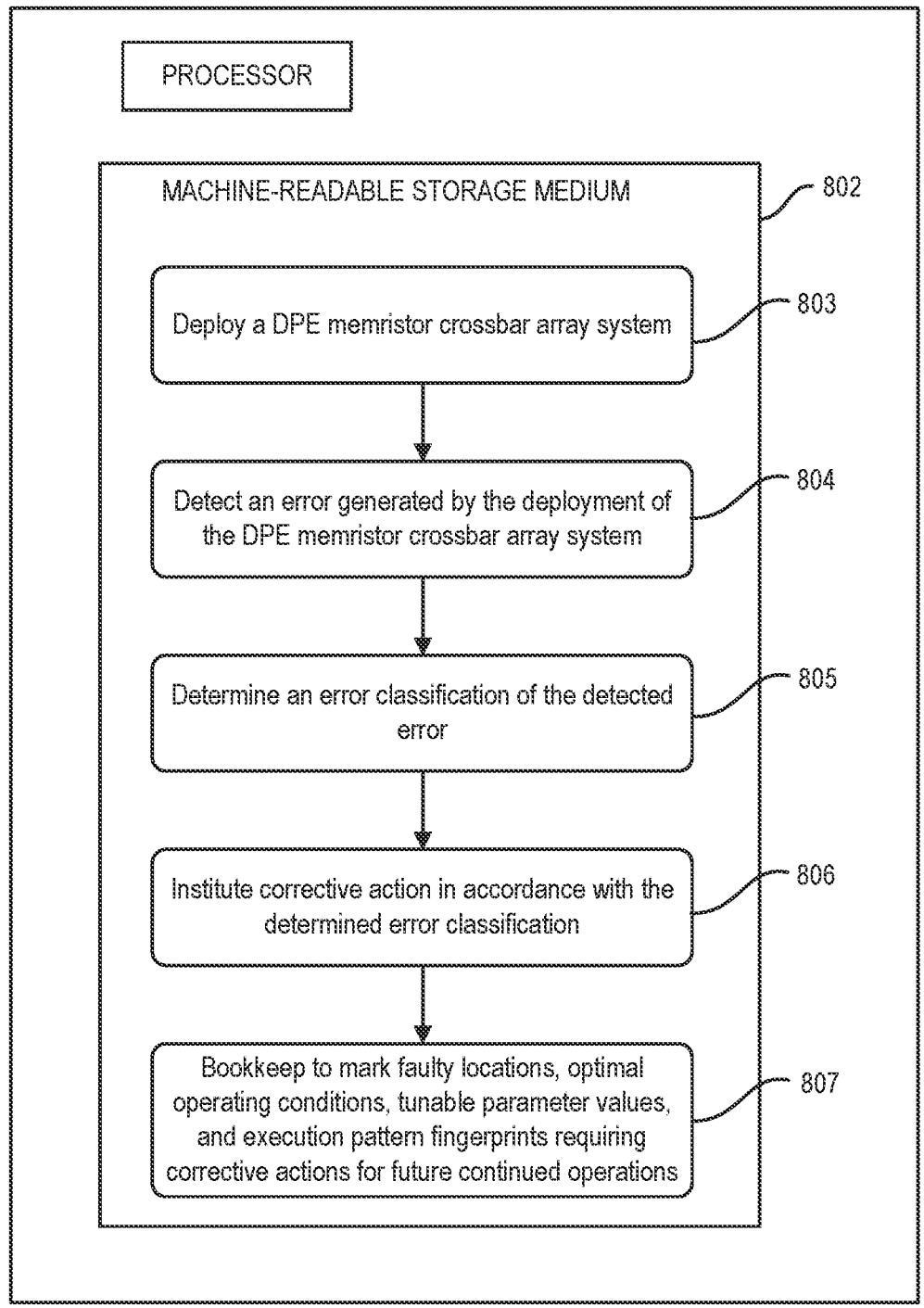
FIG. 8 is an illustration of a computing system, according to one or more examples of the present disclosure.

FIG. 8 is an illustration of a computing system, according to one or more examples of the present disclosure. The computing system 800 may include a non-transitory computer readable medium 802 that includes computer executable instructions 803-807 stored thereon that, when executed by one or more processing units 801 (one shown), causes the one or more processing units 801 to provide accelerated neural network processing by employing in-memory, analog computing.

Computer executable instructions 803 include deploying a DPE memristor crossbar array system. The deployed DPE memristor crossbar array system may notably include a plurality of partitioned memristor crossbar arrays each of which includes a primary memristor crossbar array and a redundant memristor crossbar array. The redundant memristor crossbar array includes values that are mathematically related to values within the primary memristor crossbar array. In addition, each of the plurality of partitioned memristor crossbar arrays include a block of shared analog circuits coupled to the plurality of partitioned memristor crossbar arrays. Furthermore, as described in this disclosure, the block of shared analog circuits is used to determine a digital coding of analog dot product current values generated by at least one of the plurality of partitioned memristor crossbar arrays.

Computer executable instructions 804 include detecting an error generated by the deployment of the DPE memristor crossbar array system. The error detected may be any of an uncorrectable error, an excessive number of correctable errors, a failure pattern signature, etc. In one implementation, the DPE memristor crossbar array system detects errors by implementing a Hamming metric Berlekamp coding scheme.

Computer executable instructions 805 include determining an error classification of the detected error in response to detecting that an error was generated. In one implementation of the present disclosure, each of several errors are classified by type, severity, or frequency. Computer executable instructions 806 include instituting corrective action in accordance with the determined error classification. The corrective action instituted may be in accordance with a self-healing process flow set out in a state machine. For example, the corrective action instituted includes ceasing the operation of a column of memristor devices in the operation crossbar and instead deploying a column from a spare pool of memristor columns. Lastly, computer executable instructions 807 include bookkeeping to mark faulty locations, optimal operating conditions, tunable parameter values, and execution pattern fingerprints requiring corrective actions for future continued operations.

The foregoing description, for purposes of explanation, used specific nomenclature to provide a thorough understanding of the disclosure. However, it may be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A Dot-Product Engine, comprising:
a plurality of memristor crossbar arrays, wherein each memristor crossbar array of the plurality of memristor crossbar arrays comprises:
a primary memristor crossbar array, and
a redundant memristor crossbar array;
a shared analog circuit block coupled to each memristor crossbar array of the plurality of memristor crossbar arrays, wherein the shared analog circuit block determines a dot product value of electrical values generated by at least one memristor crossbar array of the plurality of memristor crossbar arrays and wherein each memristor crossbar array is multiplexed to and shared with the shared analog circuit block; and
an error detection and correction logic block coupled to the shared analog circuit block wherein the error detection and correction logic block detects an error generated during deployment of a Dot-Product Engine matrix.

2. The Dot-Product Engine of claim 1, wherein a size of the primary memristor crossbar array is greater than the size of the redundant memristor crossbar array.

3. The Dot-Product Engine of claim 2, wherein the primary memristor crossbar array and the redundant memristor crossbar array have an equal number of rows of memristor devices.

4. The Dot-Product Engine of claim 1, wherein the primary memristor crossbar array comprises operational columns of memristor devices and the redundant memristor crossbar array comprises spare columns of memristor devices.

5. The Dot-Product Engine of claim 1, wherein each memristor crossbar array comprises memristor devices which are programmable to at least 256 states.

6. The Dot-Product Engine of claim 1, wherein the shared analog circuit block comprises a set of analog-to-digital converters and amplifiers that are operable to determine a dot product value for each memristor column of the primary memristor crossbar array.

7. The Dot-Product Engine of claim 1, wherein the error detection and correction logic block is configured to implement corrective actions to the at least one memristor crossbar array of the plurality of memristor crossbar arrays in response to a detected error.

8. The Dot-Product Engine of claim 7, further comprising a state machine block coupled to the shared analog circuit block and the error correction and logic block, wherein the state machine block is configured to record error and correction activity associated with the plurality of memristor crossbar arrays during deployment of the DPE matrix.

9. The Dot-Product Engine of claim 8, wherein the state machine block further initiates a response action to the detected error and detected input patterns with potential for errors.

10. The Dot-Product Engine of claim 9, wherein the response action consists of a self-test and characterization process to modulate key circuit parameters and thus determine optimal operating point for error free operation.

11. The Dot-Product Engine of claim 1, wherein the plurality of memristor crossbar arrays comprises at least one dedicated test memristor crossbar array programmed with known values.

12. The Dot-Product Engine of claim 1, further comprising a spare block of shared analog circuits, the spare block of shared analog circuits comprising a set of Trans-Impedance Amplifiers (TIAs) and analog-to-digital converters (ADCs).

13. A non-transitory computer readable medium comprising computer executable instructions stored thereon that, when executed by one or more processing units, causes the one or more processing units to:
deploy a self-healing Dot-Product Engine comprising:
a plurality of memristor crossbar arrays, wherein each memristor crossbar array of the plurality of memristor crossbar arrays comprises:
a plurality of memristor crossbar arrays, and
a block of shared analog circuits coupled to the plurality of memristor crossbar arrays;
a shared analog circuit block coupled to each memristor crossbar array of the plurality of memristor crossbar arrays, wherein the shared analog circuit block determines a dot product value of electrical values generated by at least one memristor crossbar array of the plurality of memristor crossbar arrays, and wherein each memristor crossbar array is multiplexed to and shared with the shared analog circuit block; and an error detection and correction logic block coupled to the shared analog circuit block, wherein the error detection and correction logic block detects an error generated during deployment of a Dot-Product Engine matrix;

detect an error generated by the deployment;

in response to detecting the error, determining an error classification of the detected error; and institute a corrective action to at least one of the plurality of memristor crossbar arrays in accordance with the determined error classification.

14. The non-transitory computer readable medium of claim 13, wherein the corrective action includes a cessation to operate a memristor column within a primary memristor crossbar with a defective memristor device and deploying a memristor column from a pare pool of memristor columns.

15. The non-transitory computer readable medium of claim 13, wherein the corrective action further includes a cessation of operation of a first analog to digital converter (ADC) within the block of shared analog circuits and deploying redundant circuits within a spare pool of analog circuits.

16. The non-transitory computer readable medium of claim 13, wherein the error detection and corrective action is instituted is performed by a state machine.

17. The non-transitory computer readable medium of claim 13, further comprising computer executable instructions to mark at least one of faulty locations, optimal operating conditions, and tunable parameter values.

\* \* \* \* \*